United States Patent [19]

Fenner

[11] Patent Number: 5,095,480
[45] Date of Patent: Mar. 10, 1992

[54] MESSAGE ROUTING SYSTEM FOR SHARED COMMUNICATION MEDIA NETWORKS

[76] Inventor: Peter R. Fenner, 600 Goodwin Dr., Richardson, Tex. 75081

[21] Appl. No.: 367,012

[22] Filed: Jun. 16, 1989

[51] Int. Cl.$^5$ .............................................. H04J 3/24
[52] U.S. Cl. .................................. 370/94.1; 370/95.1; 379/22; 340/825.04; 340/825.52
[58] Field of Search ................. 370/94.1, 85.1, 85.7, 370/95.1, 60, 60.1; 455/33; 379/59, 219, 220; 340/825.5, 825.51, 825.52, 825.03, 825.04, 825.36, 825.44

[56] References Cited

U.S. PATENT DOCUMENTS

| | | | |
|---|---|---|---|
| 4,742,511 | 5/1988 | Johnson | 370/94.1 |
| 4,843,622 | 6/1989 | Yotsutani | 379/59 |
| 4,866,431 | 9/1989 | Andros | 379/59 |
| 4,875,208 | 10/1989 | Furuhashi et al. | 370/94.1 |
| 4,887,265 | 12/1989 | Felix | 370/94.1 |
| 4,912,756 | 3/1990 | Hop | 379/59 |
| 4,953,162 | 8/1990 | Lyons et al. | 370/94.1 |

OTHER PUBLICATIONS

"LAN Interoperability Study of Protocols Needed for Distributed Command and Control" by W. L. Eldon, A. L. Miller, S. L. Morgan and B. A. Romanzo Rome Air Development Center DTIC AD-A154-003 (Mar. 1985).
"C31 Information Systems Internetwork Study" by T. C. Bartee, O. P. Buneman, J. M. McQuillan, and S. T. Walker Institute for Defense Analysis (Apr. 1984).
"Inter-network Naming, Addressing, and Routing" by J. F. Shoch IEEE Proceedings of Compcon (1978).
"Addressing Problems in Multi-network Systems" C. A. Sunshine IEEE Proc. INFOCOM (1982).
"Multi-cast Routing in Internetworks and Extended LANs" by S. E. Deering ACM SIGCOMM (1988).
"A Trade-off Between Space and Efficiency for Routing Tables" by David Peleg and Eli Upfal Journal of the ACM (Jul. 1989).
"The Landmark Hierarchy: A New Hierarchy for Routing in Very Large Systems" by Paul F. Tsuchiya ACM SIGCOMM '88 Symposium on Communications Architectures & Protocols Stanford, Calif. (Aug. 1988).
"Dynamic Hashing Schemes" by R. J. Enbody and H. C. Du in ACM Computing Surveys, vol. 20, No. 2 (Jun. 1988).
"Hashing for Dynamic and Static Internal Tables" T. G. Lewis and C. R. Cook in IEEE Computer Magazine (Oct. 1988).
"Should Tables be Sorted" by Andrew Chi-Chih Yao Journal of the ACM (Jul. 1981).
"Storing a Table with O(1) Worst Case Access Time" by M. L. Fredman, J. Komolos and E. Szemeredi Journal of the ACM (Jul. 1984).

(List continued on next page.)

Primary Examiner—Benedict V. Safourek
Assistant Examiner—Alpus H. Hsu
Attorney, Agent, or Firm—Michael A. O'Neil

[57] ABSTRACT

A plurality of disparate communication network systems communicate with each other through the use of different physical media protocols. Each of the systems has at least one input and one output. A message routing system couples a transmitter at any one system input to a receiver at any other system output using a message format that is structure independent of the location of the receiver in the system. Each receiver/transmitter device coupled to any one system input has a unique, fixed and unchangeable identification code regardless of the communication network system to which it is connected. To couple a message from any one receiver/transmitter device to a second receiver/transmitter device at an unknown location within the communication network system, a message format is transmitted from the sending location containing the fixed, unique identification code of the receiving station. A routing system having a plurality of intermediate routing devices receives the message format and couples it to the receiving station at the unknown location using only the fixed, unique identification codes of the transmitting and receiving stations and the addresses of the intermediate routing devices for determining routing.

18 Claims, 4 Drawing Sheets

OTHER PUBLICATIONS

"Hashing in Practice, Analysis of Hashing and Universal Hashing" by M. V. Ramarkrishna Proceedings of ACM SIGMOD (Jun. 1988).

"Linear Hashing with Overflow-Handling by Linear Probing" by P. A. Larson in ACM Transactions on Database System (Mar. 1985).

"Analysis of Dynamic Hashing with Deferred Splitting" by E. Veklerov in ACM Transactions on Database Systems (Mar. 1985).

"Partial-Match Retrieval Using Hashing and Descriptors" by K. Ramamohanarao, J. W. Lloyd, and J. A. Thom in ACM Transactions on Database Systems (Dec. 1983).

"New File Organization Based on Dynamic Hashing" by Michael School in ACM Transactions on Database Systems (Mar. 1981).

"Analysis of Uniform Hashing" by Per-Ake Journal of the ACM (Oct. 1983).

"Bounded Index Exponential Hashing" by David B. Lomet ACM Transactions on Database Systems (Mar. 1983).

"Reciprocal Hashing: A Method for Generating Minimal Perfect Hashing Functions" by G. Jaeschke Communications of the ACM (Dec. 1981).

"Dynamic Hash Table" by Per-Ake Larson Communications of the ACM (Apr. 198).

"Data Compression" by D. A. Lelewer and D. S. Hirschberg, ACM Computing Surveys (Sep. 1987).

"Arithmetic Coding for Data Compression" by I. H. Whitten, R. H. Neal, and J. C. Cleary, Communications of the ACM Jun., 1987.

"A Working-Set Coprocessor" by Milan Milenkovic, SMU Technical Report (Mar. 1989).

"An Adaptive Dependency Source Model for Data Compression" by David M. Ambrahamson, Communications of the ACM (Jan. 1989).

"A multiplication-Free Multialphabet Arithmetic Code" by J. Rissanen and K. M. Mohiuddin IEE Transactions on Communications (Feb. 1989).

ADDRESS COMPRESSION FOR ROUTING TABLE INDEX

MESSAGE ROUTING SYSTEM FOR SHARED COMMUNICATION MEDIA NETWORKS

FIELD OF THE INVENTION

The present invention relates to data communication between independent communication networks in general and in particular to message routing systems for communication between entities in point-to-point and shared media networks utilizing a message format system that is independent of location address structure.

BACKGROUND OF THE INVENTION

Data communication between computers has become a standard part of worldwide networks in many areas of endeavors. These individual networks gather data about diverse subjects and exchange information of common interest among various media groups. Most of these networks are independent communication entities that are established to serve the needs of a particular group. Some use high speed connections while others use slow speed networks. Some use one type of protocol while others use a different type of protocol. Other well-known differences between networks also exist. There has been considerable effort expended in an attempt to make it possible to interconnect disparate physical networks and make them function as a coordinated unit.

Whether they provide connections between one computer and another or between terminals and computers, communication networks are divided basically into circuit-switched or packet-switched types. Circuit-switched networks operate by forming a dedicated connection between two points. Such a dedicated circuit could be represented by a telephone connected through a circuit from the originating phone to a local switching office, across trunk lines to a remote switching office and finally to the destination telephone. When that circuit is complete, no other communications can travel over the wires that form the circuit. The advantage of such circuit lies in the fact that once it is established, no other network activity will decrease the capacity of the circuit. The disadvantage is that concurrent communication cannot take place on the line or circuit.

Packet-switched networks take an entirely different approach. In such system, traffic on the network is divided into small segments of information called packets that are multiplexed on high capacity intermachine connections. Each packet carries identification that enables other units on the network to know whether they are to receive the data or are to transmit it to another destination. The chief advantage of packet-switching is that multiple communications among information sources such as computers can proceed concurrently with connections between machines being shared by all machines that are communicating. The disadvantage is that as activity increases, a given pair of communicating devices can use less of the network capacity.

A new technology has been developed that is called Internet and it accommodates information or communication networks having multiple, diverse underlying hardware technologies, or physical media protocols, by adding both physical connections and a new set of conventions. One of the problems with the use of Internet is that addresses refer to connections and not to the device itself that is sending the information. Thus, if a communication source, such as an aircraft for example, moves from one communication network to another, its Internet address must change. Specifically, if an aircraft is transmitting a particular location address code in one communication network in the Internet system and it moves to another, its Internet address must change. It is similar to a traveler who has a personal computer operating with a first communication network. If the computer is taken on a trip and connected into the information system after reaching the new destination, a new location address for the computer must be obtained for the new destination. It is also similar to moving a telephone from one location to another. A new telephone number must be assigned to the telephone at the new location. The telephone cannot be reached at the new location with the old number. Further, when routing a signal from one station to another through a plurality of nodes forming multipath connections, the message format contains a destination location address that is used to make the routing decisions. When the system has multiple addresses, the route taken by the packets traveling to a particular station address depends upon the location code embedded in the station address.

Thus, two problems occur in such message communication networks. The first is the requirement to change the address code of the communication source when it is at different locations in the network and the second is routing the message to the receiver if the address has changed. It can be seen, then, that with the presently existing system, if host A transmits a message to host B with a specific location code, by the time the message arrives at that location, host B may have moved to a new information processing network and changed its location code to conform to the new system and thus could not receive the message transmitted by host A. Host A must know that host B has entered the new information processing system and then must change the format of the new location address in order to contact host B.

The present system overcomes the disadvantages of the prior art by simply assigning a fixed, unique and unchanging identification code to both host A and host B. As host B enters into a new network access system, it transmits its identification code to the nearest node and all of the nodes interconnecting all of the disparate networks each store, with the unique identification code of host B, the address of those nodes which can communicate with host B so that a path can be completed through the nodes between host A and host B.

In the prior art, hierarchical logical routing is used to address highly mobile end-systems (computers on ships and aircraft, etc.) that are simultaneously connected to multiple communication paths and employ multicast message traffic. Heirarchical routing schemes have great difficulty solving this combined set of problems and a new approach must be used to overcome the difficulties in using hierarchical routing to meet the user's diverse requirements.

Further, in the prior art, a logical network address of larger than 32 bits was too large to be used as a directory access method to locate a receiver at a location address specified in the message format. Specialized hierarchical address structures which embed network location information have been employed to reduce the size of the access index to the routing table and also to reduce the size of the routing table. This approach couples the address structure to the Internet routing software design.

There are various "hidden assumptions" of hierarchical addressing. These "hidden assumptions" are (1) the processing load of the router CPU increases as the size of the routing table increases and (2) computer memory is a scarce and expensive resource. The present invention overcomes the first of these problems while computer memory technology has addressed the second problem by making very large memories cost effective.

Traditional approaches for designing a network address structure have either been intimately entwined in the design of efficient routing look-up tables or assigned by a central authority such as ARPANET. Neither of these approaches gives much if any thought to the needs, desires or ease of use of the group which must make operational use of the system. In an age of fourth generation database languages and high level compilers, network addresses are basically hand-coded in low level language. Addresses and address structures are difficult to change as a mobile end-unit moves from one communication network to another. Experts are often required to ensure that operational equipment is properly integrated into the system. ISO (International Standards Organization) addressing provides a basis for a much better approach but the overall design and administration of a network addressing structure must be elevated to an easily supported, user friendly, distributed architecture to effectively support the user's long-term needs.

Traditional directory access methods, whether for Internet routing, databases or compiler symbol tables, fall into three basic categories:

(1) Sorted Tables. The keys are sorted by some rule which allows a particular search strategy (e.g., binary search) to locate the key. Associated with the key location is a pointer to the data.

(2) Tree Structures. Parts of the key field are used to traverse a tree data structure to a leaf node which holds the data or a pointer to the data.

(3) Hashing. Some arithmetic function is applied to the key which compresses the key field into a chosen integer range which is the initial directory size. This integer is the index into the directory which usually contains a pointer to the data.

Each of these techniques has advantages and disadvantages when applied to the Internet routing table access design. Sorted tables provide the potentially most compact storage utilization at the cost of having access computations which grow with the number of addresses (keys) active in the system. Computations for sorted tables grow proportional to the log of the number of keys plus one. Using sorted tables, the router processing will slow down as the number of active addresses increases. But the desirable result is to make computation independent of the number of active addresses. It has been theorized, without providing a method, that a scheme to access sorted tables could exist which always allows access in two probes. To date, no methods have been proposed which approaches this theoretical result.

Tree data structures have been widely employed for directories, particularly for file systems, such as the UNIX file system where larger amounts of auxiliary disc storage is being managed. Trees offer access times that are proportional to the length of the address (key). Trees trade off memory space for processing load. More branches at each level decreases the processing but uses much more memory. For example, a binary tree uses two locations at each level for each bit in the address field for which there is an active address. The binary tree processing of an eight bit octet requires eight memory accesses as well as unpacking the bits from the octet. On the other hand, processing a 256 way tree takes one memory access using the address octet as an index at each level. A 256 way tree requires 256 locations at the next level for every different octet active (a valid value) at the current level. An address of six octets with ten valid octet values in each octet position would require $256 \times 10^6$ (256 million) locations, rapidly reaching an unrealizable size on current computer equipment. With current realizable computer memory sizes, pure tree structures do not appear to offer a viable structure for real time, address independent directory access method.

Hashing has often been used over the last several decades to create directories where fast access is desired. One system uses a multi-level hashing scheme as the file system directory structure. The Total database system is based on hashed key access. Many language compilers use hash tables to store symbols. Hash table schemes have good average access costs—often a single access, but can degrade drastically when the table becomes too full or the hashing function does not perform a good job of evenly distributing the keys across the table. Some techniques called "linear hashing" and "dynamic hashing" have provided the method of expanding the hash table when a particular bucket becomes too full instead of using the traditional linked list overflow methods. These techniques generally require about 40% more space than the number of active addresses (keys) to achieve single access speed without employing overflow methods.

All general hashing techniques use a variation of several common randomizing functions (such as dividing the key by a prime number and using the remainder) to "compress" the key field into a much smaller integer index into the hash table. Hashing functions have traditionally been viewed as one-way, randomized mapping of the key set into the hash space. The index computed by the hashing function could not be used to reconstruct the key. If for a particular hash function there exists a reciprocal function which maps the index to the unique key which generated the index, then the compressed keys could be stored in the directory.

The present invention overcomes the disadvantages of the prior art by considering a flat, as opposed to hierarchical, logical routing address space with unique identifiers assigned to each transmitter and receiver to vastly simplify the modern communication problems of addressing highly mobile end-systems which are simultaneously connected to multiple communication paths and employ multicast message traffic.

Further, the present invention employs a reversible arithmetic code compression technique to reduce the logical network address of up to 128 bits to a unique integer value which preserves any hierarchical ordering of the network address.

Also, the present invention employs dynamic hashing and memory allocation techniques to automatically adjust the size of the routing table directory and routing records to accommodate the number of end-system addresses currently active in the communication system. These techniques provide a selection of approaches to allow graceful degradation of the routing efficiency when the memory available for routing tables is full.

Finally, the system improves over the prior art by using a message format that is structure independent of the location of the destination of the message receiver.

Arithmetic coding, when applied to addresses as known length keys, provides several advantages for table look-up when the addresses are known or can be learned in advance as they are in communications applications. The proposed arithmetic coding routing table design provides direct support for mobile, multi-homed, shared network end-systems employing multicast and unicast messaging while minimizing the effects of the "hidden assumptions" that have lead to reducing the routing table size by embracing hierarchical routing schemes.

First, the identification encoding parameter tables are easily constructed by counting the occurrence of a particular symbol value and the accumulative distribution over all octet occurrences. That is, the tables are scaled to the statistical occurrence of each octet value. When a "bucket" overflows, dynamic hashing approaches can be used to expand the directory or parameter tables.

Secondly, arithmetic coding can be constructed to operate on each symbol position in the address field as it arrives, allowing processing to begin as soon as the first address symbol arrives.

Thirdly, arithmetic coding preserves the hierarchical (left to right precedence) of the ISO addresses being encoded. This is desirable if an Internet router only has knowledge of the network address but the Internet header carries the full destination address of a succeeding system node.

Finally, a constant known set of computations is required for each symbol of the address field independent of the number of address symbols or the number of active Internet addresses.

These features make the arithmetic coding used herein an ideal candidate for the routing table directory structure that is independent of a location address in a router, gate way or end-system.

The present invention provides a very fast, automatically expandable, source filtered Internet routing scheme totally independent of the internal logical or physical structure of the network addresses in the message format that it is routing. Addresses are just unique identification numbers represented by a string of symbols of known length. Each Internet router learns the location of these numbers within the network from the Internet protocol traffic, from the source addresses of the packets it receives, and from a network management protocol.

Address independent routing tables provides the following direct benefits:

They provide a very fast routing table access scheme that is capable of supporting fast packet switch designs for very high speed media such as FDDI (i.e., routers which begin the outbound transmission of the packet as soon as possible after receiving the Internet header and before the whole packet has been received).

They allow source address filtering for efficient multicast operation and security partitioning of the network.

They allow independent automatic generation of network addresses from a user name space by a network name service. This facilitates using the same Internet software in disconnected networks with different addressing authorities and different address structures.

They allow for orderly expansion, restructuring and redesign of the user name space without changing the Internet code or table structure.

They reduce initial system procurement and logistic support costs because no special coding is needed for different networks.

They reduce life cycle system costs because the Internet routers automatically adapt to network changes and they can be expanded without routing table modification.

The present invention combines arithmetic coding with dynamic hashing to provide a very high speed method and system for detecting the 48 bit physical addresses in a Media Access Controller (MAC). The present system guarantees the acceptance or rejection of a frame. This technique always performs address detection functions within the transmission time of the address field plus a small fixed number of octet clocks depending On the logic implementation chosen. Specifically, the present system provides the following features: (1) variable length addresses with no known internal structure and processed with a number of memory accesses and a processing time proportional to the number of octets in the address field; (2) the size of the routing tables is directly proportional to the number of active addresses known to the router and within the practical limits of currently available microprocessing systems; (3) and the computational operations required to access the routing table for any address is linearly proportional to the length of the address field and these computations are reasonably performed by currently available microprocessor systems.

SUMMARY OF THE INVENTION

Thus the present invention relates to a system for routing a message between a source and a destination and which utilizes a message format that is structure-independent of the location of the message destination, said system comprising at least a first signal transceiver device having only a first fixed unique identification code wherever the transceiver device may be located; at least a second signal transceiver device for communicating with the first transceiver device and having only a second fixed unique identification code wherever the second transceiver device may be located; and routing nodes for coupling a transmitted signal from the first transceiver device to the second transceiver device at an unknown physical location within the system using a routing message format containing only the first and second transceiver fixed unique identification codes and addresses of the routing nodes with a message format that is structure-independent of any transceiver location code.

BRIEF DESCRIPTION OF THE DRAWINGS

The present invention will be more fully understood in connection with the accompanying drawings in which.

DETAILED DESCRIPTION OF THE DRAWINGS

Figure 1:
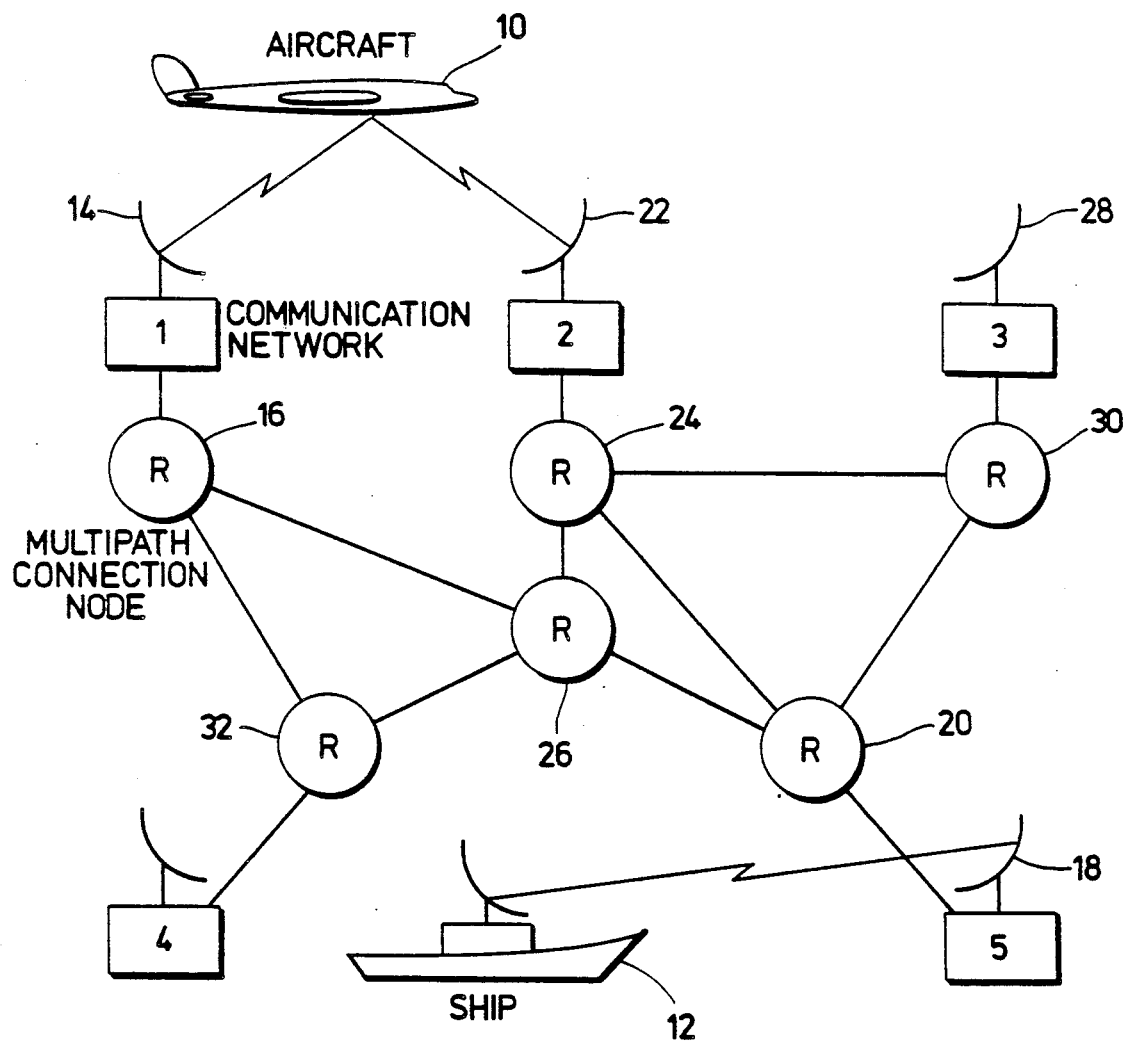
FIG. 1 is a general diagrammatic representation of an Internet communication system that, as used in the prior art, uses information handling nodes and network addresses for each host that must be changed as the host moves from one communication network to another thereby requiring a complex and cumbersome system to enable data communication from a message transmitting host to a system receiving host; when modified by the present invention, the system of FIG. 1 enables a message routing system using a message format having an internal logical or physical structure that is totally independent of the message receiving host location address.

There are many communication networks existing today which are independent entities with respect to each other such as shown in FIG. 1. Each system 1-5 uses a particular hardware technology appropriate for its own communication problems; some use high speed networks; others use slower speed networks to interconnect machines. There are long haul networks and local area networks (LANS). There are shared media networks such as ETHERNET, TOKEN RING, TOKEN BUS, FDDI and the like, each of which has a different physical media protocol. Each of these network information systems may have its own protocol for handling information within the system.

When electrical wires or cables are used to couple shared media networks, the size of the net is limited by signal attenuation to a few hundred meters; thus, the name Local Area Networks. There is no reason to limit the area of coverage other than the restrictions of the media itself. With the increased use of fiber optics, the span of these shared media networks is expanding to several kilometers and eventually will be able to span the entire continent.

In the prior art, when an external device or host such as an aircraft 10, ship 12 or other receiver/transmitter (transceiver) station is communicating with anyone of these systems 1-5, it must have an identification of its own which is recognized by the protocol of the system with which it is communicating. In such systems, if aircraft 10 wishes to communicate with ship 12, aircraft 10 must transmit into the system, among other things, a fixed address of the message receiving ship 12. The protocol of the system can then use the address information to route the message through the system to the ship 12 at the address indicated.

However, when a host passes from one communication system to another, the address code of that host must be changed to be conformed with or admitted to the new communication system. Thus, if a host passes from an FDDI to an ETHERNET system, the address code of the host must be changed in order to enable the new system to accommodate it. This change may require a great deal of manipulation of data within the system and require expensive additional equipment to enable the appropriate changes to be made. Further, by the time one host (ship 12) sends a message to the last known address of the moving host (aircraft 10), the moving host may have entered the range of a new communication network and have a different address code thereby causing a problem in receiving the message sent with a network dependent address from the message sending host.

The present invention modifies the system of FIG. 1 to overcome the disadvantages of the prior art by allowing each host to have a fixed unique identification code instead of an address code which changes to identify itself with whatever communication network it may operating. With the present invention, if host A passes from a first communication network system to a second network system (as for instance aircraft 10 flying from communication network 1 to network 2) host A may be located by host B (ship 12) who simply transmits into the communication routing system the unique identification code of the host A with which it desires to communicate. It does not know where in the system, or in a plurality of interconnected communication systems, the host A is located.

The interconnecting systems shown in FIG. 1 include a plurality of nodes 16, 20, 24, 26, 30 and 32 forming multipath connections between the plurality of network communication systems 1-5. The nodes can interface with each other even though they are in different communication systems simply by using protocols and procedures that are well-known in the art.

If aircraft 10 desires to contact ship 12, it simply transmits a message format including its own unique code and the unique identification code for ship 12 to the nearest system 14. The receiving system 14 sends the message to node 16 which checks its memory tables to determine if it has stored the address of the last node (26 or 32) communicating with ship 12. If not, it stores the unique identification code of aircraft 10. It also forwards to all interconnecting nodes, except the one from which the message was received, 26 and 32 in this case, the message including the identification code of ship 12 as well as the identification code of aircraft 10. In like manner, each of the interconnecting nodes 26 and 32 checks its memory storage tables to see if it has received and stored the identification code for either aircraft 10 or ship 12. If not stored, it stores the unique identification code of aircraft 10 and the address of the forwarding node, and forwards that information to the succeeding nodes. Thus node 26 forwards that information to nodes 20 and 24 but would not forward it to node 32 since node 32 is also coupled to node 16 which has that information. Node 20 will be updated by node 26 since it is the closest node. Eventually, ship 12 will contact its nearest node 20 coupled to communication network system 5 through radio receiver 18 to identify itself. Source node 20 has the unique identification code for aircraft 10 stored in its memory table and will store the identification code and received route for ship 12 in its memory table. Node 20 will now contact the nearest node 26 from which it received the identification code for aircraft 10 and couple ship 12 to that node. Node 26 again will check its memory bank and find the nearest node from which it had received the identification code for aircraft 10 (node 16). A communication path is thus completed between aircraft 10 and ship 12 and they can communicate with each other even though initially one did not know the location of the other in the system. It will be noted that in this case there were no specific address locations of either aircraft 10 or ship 12 in any of the message formats that were transmitted or received. They simply contained the identification code of the message source and message receiver that was stored by the nodes and the addresses of each node in the path having that information, and the information was recalled as necessary to establish communication paths between aircraft 10 and ship 12.

If ship 12 is moving and passes from the control of a first network communication system 4 to a second network communication system 5, the nearest node 32 in the first communication system 4, after a predetermined period of time, drops from its memory bank the identification code and routing information of ship 12. However, the transmission by ship 12 of its identification code to the nearest node 20 in the second communication system 5 is recorded by that node and transmitted to the other nodes throughout the interconnected system so that each node now knows the updated location of node 20 that is nearest to ship 12. In that manner, either aircraft 10 or ship 12, even though either or both are moving, can continually communicate with each other through an interconnected system of communication networks without having the specific system address of the other.

Since any given node may receive information from one or more nodes, standard protocol is used to determine the node from which the given node first received the information. That would be the closest node. If, in the event of a transmission back along that path, it was found that the closest node was for some reason out of the system, it could then pick one of the other possible routes and send the information to a different node along one of those routes.

Further, each of the nodes must be able to recognize when a message is for a single node (unicast), a group of nodes (multicast) or all nodes (broadcast). Such requirements can be accomplished by systems that are already well-known in the art.

Further, each node is an information source to some nodes and an information destination for other nodes. Thus, each node has to keep a source index table and a destination index table. See FIG. 2. When aircraft 10 attempts to contact ship 12, aircraft 10 transmits into the nearest node its own identification code as well as the identification code of ship 12. The nearest node stores the source (aircraft 10) identification code in a source index table and in a destination index table. If a node has the destination identification code stored, it also has stored the address of the node from which it received that information in both its source protection record and destination route record. Of course, it may have received that information from several nodes and the addresses of all of those nodes are stored as sources and destinations. The source protection record, when combined with the destination route record, eliminates the routes to all of the other nodes except the nearest route through the use of a buffered routing logic circuit. Thus a path is connected between the two closest nodes for carrying the packet of information from aircraft 10 to the next nearest node. This process repeats in each node until the information packet arrives at ship 12.

Referring again to FIG. 1, as aircraft 10 is detected by receiver 14, the identification code information transmitted by aircraft 10 is fed into a communication network or system 1 and node or router 16 notifies the other nodes or routers in the system of the identification code. In like manner, as receiver 18 detects ship or vessel 12, communication network or system 5 updates node or router 20 with the ship 12 identification code. It, in turn, notifies the other nodes or routers within the complex communication network or system. As receiver 22 detects the movement of aircraft 10 into its area, communication network or system 2 updates node or router 24 which then updates the other nodes or routers within the system. Node 16 no longer receives information from system 1 but now updates its information from system 2 through nodes or routers 24 and 26. As aircraft 10 continues to move, receiver 28 will detect aircraft 10 and notify router 30 through system 3. Again, router 30 notifies the other nodes or routers within the system. Node or router 24 will no longer receive its information from network 2 but will be updated through router 30 as to the identification code of aircraft 10.

The problem with such vehicle movement with the prior art system, as stated, is that each of the communication systems 1-5 are different networks and may use different types of media access protocols for operation which require the network address of the moving vehicle to be changed. Thus many communication networks service their stationary and mobile users with a wide variety of media ranging from satellite links, high frequency radio, local area networks (LANS) and dedicated point to point circuits as illustrated in FIG. 1. Shipboard LANS, including SAFENET I (IEEE 802.5 Token Ring) and SAFENET II (ANSI X.3-139FDDI), are used to support command, control, communications and intelligence in certain systems. The use of standard ISO (International Standards Organization) Internet protocols and the development of very high performance, low latency packet-switched gate ways between these networks is critical to reliable communications between mobile vehicles.

As stated, in the prior art, the aircraft 10 must have assigned to it a code representing its physical address with respect to communication system 1. Physical addresses are associated with interface hardware. Thus, moving the hardware interface to a new machine or replacing a hardware interface that has failed changes the physical address of a particular host. In like manner, as the aircraft moves from system 1 to system 2 in FIG. 1, because system 2 may operate with a different media access protocol, the coding of the physical address of aircraft 10 must be changed to meet the standards of system 2. This means that if ship 12 attempts to communicate with aircraft 10 using the physical address at the last known address location in system 1, it cannot locate aircraft 10 without a new location code because aircraft 10 has moved into a new communication system network and has changed its physical address code.

The novel system of the present invention modifies FIG. 1 to provide an Internet routing table that uses a flat logical address structure to provide fast and efficient route processing of both multicast and unicast message traffic. In the present system, the physical address structure is removed from the design and operation of the Internet routing by treating the message addresses as a symbol string without predetermined internal structure and processing them as if they are a unique identification code representing the host. This approach is made possible by employing an arithmetic code compression technique as a hashing function for the routing table access method. By managing and manipulating logical network addresses within the system, mobile end-systems can keep the same network identification code (not physical address) as they move from communication network to communication network. Similarly, group or multicast addresses may be allocated without regard to their physical network connection. Thus, considering the use of the present system with the networks of FIG. 1, aircraft 10 and ship 12 maintain the same identification code even though they move from one of the networks 1-5 to another. When aircraft 10 is in communication with network 1, node 16 notifies all of the other nodes 20, 24, 26, 30 and 32 in the system that node 16 is in contact with aircraft 10. In a like manner, when ship 12 is in communication with node 20 through network system 5, node 20 notifies the other nodes in the system that it is in communication with ship 12. If aircraft 10 moves to network system 2, node 24 updates all of the other nodes in the system and their data is changed to identify node 24 as the new node in contact with aircraft 10. This system then enables each node to store data representing the address of the last node communicating with a particular mobile vehicle and not the physical address of the vehicle. This allows communication from aircraft 10 to ship 12 throughout the various communication systems without either aircraft 10 or ship 12 being required to change network addresses as they move from access point to access point and without knowing the specific network location of the other.

Each of the nodes 16, 20, 24, 26, 30 and 32, may utilize any well-known means in the art for providing point-to-point and demand assignment access protocol message transmissions to communicate with each other. There are various systems well-known in the art which allow communication network systems using one protocol to communicate with another system using a second protocol and they will not be described here.

The present system may be utilized as a Media Access Controller (MAC) multi-way switch in each node as an electronic module which detects the physical layer node address fields of the data packets arriving from one node and uses those addresses to route (switch or bridge) the packet to another node which is a path to the physical station with a particular node destination address. The MAC level multi way switch examines the bits which constitute the node destination address field to identify which, if any, of the nodes connected to the switch should be presented the message packet for transmission. This operation is often called "destination address filtering."

A number of shared media networks previously mentioned have been standardized for common use and inter-operation of different vendor equipment. The most common of the LAN standards are ETHERNET, TOKEN BUS, TOKEN RING AND FDDI. Each of these shared media networks sends information as a variable length sequence of bits called a packet. Each packet has a fixed number of the initial bits transmitted which are dedicated both in position and size to a packet header. This header contains a destination address field and a source address field along with other housekeeping information bits. All four of the LAN standards listed above employ the same number of bits with the same meaning for both the source and destination address fields, although the housekeeping fields are different for each.

Shared media networks operate basically in the same way. The media is shared so only one node or station (one MAC) may transmit at a time and all of the other nodes or stations listen. In order to identify the recipient of the message, a destination node address is located in a specific location at the beginning of each information frame. Each listening station examines these destination node address bits to determine if the packet is for it. The receiving station (the destination node) needs to know where to send a response to the received packet and thus the packet has source node address bits at a specific location (usually just after the destination node address). The major differences in the various LAN standards are transmission speed and the scheme each uses to guarantee that only one station at a time is allowed to transmit on the media.

The Media Access Controller (MAC) is the defined entity in each of the above-listed LAN standards which connects the computer side logical level interface to the physical media. MAC isolates the logical data stream from the physical media so the circuitry on the computer side of the MAC only deals with the header and information bits.

Thus, the MAC-level switch or bridge is an electronic module which connects similar or dissimilar physical shared media networks each of which employ identical addressing field definitions. The switch transfers information packets originating from stations or nodes on one network to destination stations or nodes on another network. If station A on a shared media network desires to send a packet to station F, then station A places codes representing "F" in the destination node address field and "A" in the source node address field of the packet header of the packet being transmitted. When the MAC of station A gains access to the shared media, it transmits the packet along with other packets it may have queued for transmission. Other connected MACs all receive the packet header and examine the destination node address field. Station F recognizes the address as his own and receives the remainder of the packet. All of the other stations on the network see that the packet is not for them and disregard the rest of the packet. Neither the source node address nor the destination node address are changed in any way.

All of the standard LANS listed above have a group addressing scheme where one station may send one packet simultaneously to many other stations belonging to the group. This feature is called multicast and takes advantage of the shared media to send the packet just once rather than having to send an individual packet to each station in the group. Suppose station A wishes to send a packet to all stations in a group identified as 110 which includes stations identified as F, G and N. Station A would then put the group "110" in the destination node address field and "A" in the source node address field. When MAC A gains access to the first network, it transmit the packet. Stations F, G and N would then detect their group address and accept the packet. Other MACs would not.

Figure 2:
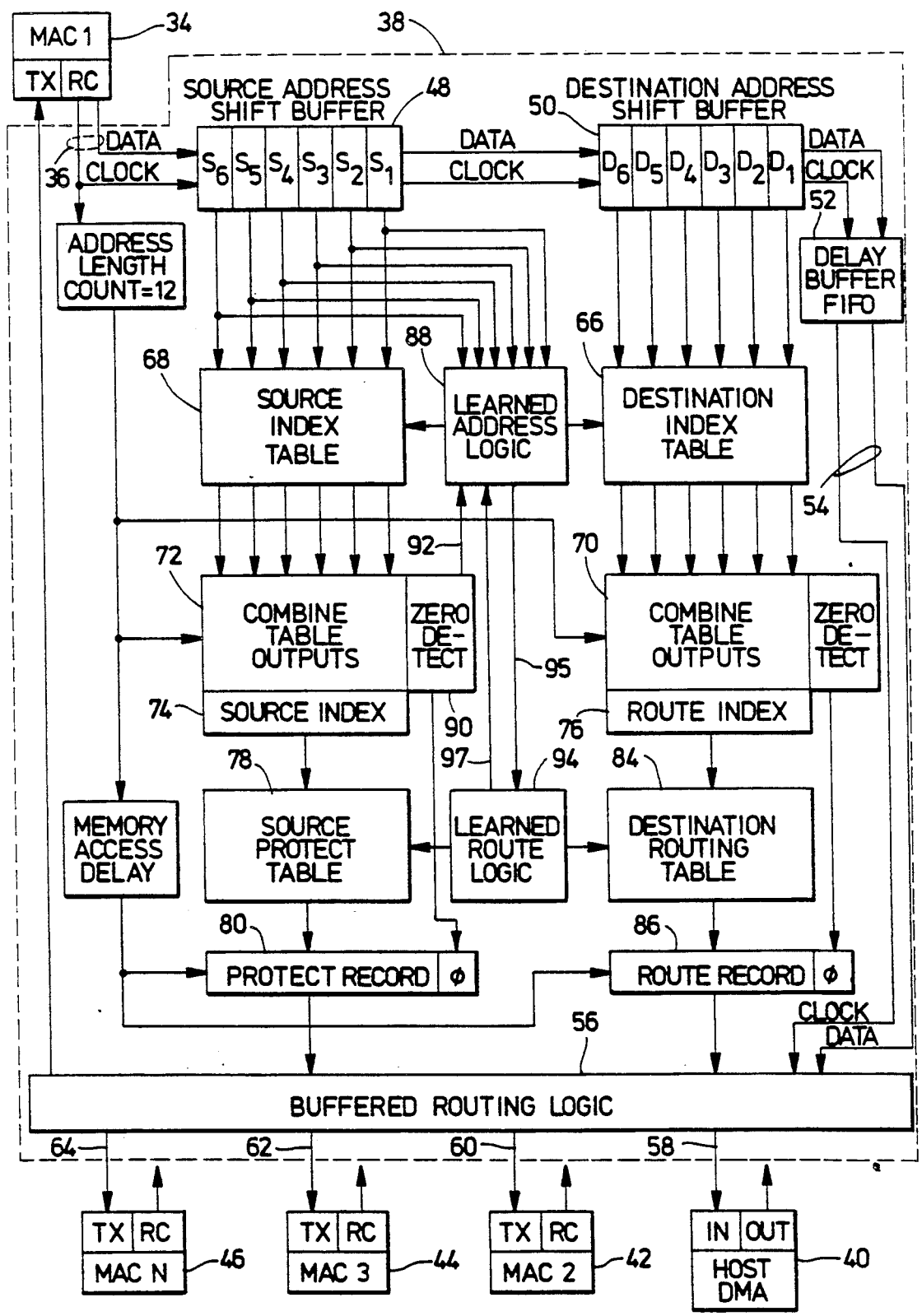
FIG. 2 is a schematic representation of the circuitry in an individual system node using parallel processing to detect the address of the next node or nodes in the system that are to receive a packet of information.

FIG. 2 is a schematic diagram of a MAC switch 38 which couples a Media Access Controller 34 at one node level to desired Media Access Controllers 40, 42, 44 and 46 at other levels.

The MAC level switch 38 shown in FIG. 2 examines the source node address field of the incoming information to determine if any or all of the other connected nodes are protected from receiving the information from the incoming source. This operation is often called "source address filtering."

Thus in FIG. 2, MAC 34 may transmit data and clock information on lines 36 to switch 38 which determines which of the destination MACs 40, 42, 44 and 46 are to receive the information. In switch 38, the data and clock signals on line 36 are serially coupled to a source address shift buffer 48 and then to destination address shift buffer 50. The data is then transferred from destination shift buffer 50 to delay buffer 52 which is a first-in, first-out device. The output of delay buffer 52 on line 54 is coupled to the buffer routing logic 56 which generates an output on lines 58, 60, 62 and 64 depending upon the destination address filtering operation performed by the switch 38.

The Media Access Controller switch 38 transmits or forwards data it receives, and accepts data for transmission as eight parallel data bits called a data octet. It processes address symbols which are a fixed number of consecutive bits from the address bit string and may be from two to any number of bits in length. One size symbol is the "eight" bit octet which is the symbol size used in the address routing table circuits presented in FIGS. 2 and 3. The number of symbols in the maximum address length to be processed for a particular implementation is a design and management decision. The examples presented in FIGS. 2 and 3 use six octets as the maximum address length, since this is the length of the IEEE standard physical layer (MAC level) address used by Ethernet, Token Ring, and FDDI. The International Standards Organization (ISO) network layer (IP.ISO 124) employs a variable length, up to 20 octets, for the source and destination address 128 and 126, as shown in FIG. 4. The designs shown in FIG. 2 and FIG. 3 would be able to process IP.ISO 124 addresses 126, 128 up to "six" octets in length. MAC switch 38 is responsible for aligning the data properly on the octet boundaries such that the destination and source addresses start and end on octet boundaries. Furthermore, in the LAN standards listed above, the source address field always immediately follows the destination address field and the two are always the same size. A common size for the address fields is 48 bits or 6 octets each. The address detection logic examines both the destination and source address fields represented by the octets shifted into buffer 48 and buffer 50. Six octets are in each buffer. When the twelve octets are all stored, each octet is used as an address into a 256 element index table for that address octet position. This requires six destination index tables 66 and six source index tables 68. The output of these tables (the contents of the location addressed by each octet) is then arithmetically combined in combiners 70 and 72. One method of arithmetically combining these outputs adds the six outputs of the source index table 68 to compute the source index 74. It also adds the six destination table 66 outputs to compute the route index 76. The source index 74 is used as the address into the source protect table 78 and the output of that location is the source protect record 80 which is coupled to the routing logic 82. Similarly, the route index 76 is used as the address of a location in the destination routing table 84 and the contents of that location is coupled to route record 86. The outputs of the protect record 80 and route record 86 are used by the routing logic 56 in a well-known manner to determine which destination MAC is to receive the message.

FIG. 2 may also operate as an internet level switch (router) 38, operating on IP.IS0 header 124 destination 126 and source addresses 128 by shifting in the IP destination and source addresses. When aircraft 10 in FIG. 1 transmits a packet with its unique internet source identification code to one of the nodes in a network, the source address of aircraft 10 is shifted from source address shift buffer 48 (FIG. 2) into learned address logic 88. If that source address is a new address not stored in source index table as indicated by a zero detect, it is stored in both the the source and destination index tables 66 and 68. If, after a predetermined amount of time, that information is not confirmed by a subsequent transmission, the learned route logic 94 generates an output 97 to the learned address logic 88 telling it to delete the address from the both source and destination index tables 66 and 68. This means that the aircraft 10 has moved to a different network and may be updating a new node in the new network. Subsequently, the new network node then sends a message to switch 38 in the old node and stores the source address of the new node in the route record 86 associated with the unique source address for aircraft 10. By keeping track of the source addresses of the various nodes that are transmitting information concerning a particular identification code, learned route logic 94 causes the destination routing table 84 to delete old source nodes as destinations for particular incoming data packets and add the addresses of new nodes as the destination. The source protect table 78 in each node stores the source protect record 80 (also called the MultiCast Record List 134 in FIG. 4), which has information defining a shortest path from a particular source to that node. This shortest path information is computed from the messages received from forwarding nodes using a shortest path spanning tree algorithm well known in the art. The source protect record 80 may be modified by management decision to prevent messages from a particular source identification code from being forwarded on particular paths to other nodes.

The destination routing table 84 (also called the Outbound Record Linked List 132 in FIG. 4) contains the shortest path information from this node to the current connnected nodes for each unique identification code currently stored in the source and destination index tables. The current route record 86 is this shortest path information for the destination address currently in buffer 50. This information is computed from the messages received from forwarding nodes using a shortest path spanning tree algorithm well known in the art. Thus, in FIG. 1, if node 26 has received information from source nodes 16, 24 and 32, and it receives a data packet for node 20, the protect record 80 from the source protect table 78 and the route record 86 in FIG. 2, when processed by the buffered routing logic 56, will prevent node 26 from transmitting the information back to nodes 16, 24 and 32 but allow it to be transmitted to the destination node 20. Thus, the information from an incoming node or MAC 34 to a particular switch 38 may be transferred to the desired destination MAC 40, 42, 44 or 46 by the buffered routing logic 56 in the manner explained.

In FIG. 2, the address detection logic employs separate tables and arithmetic processing elements for both the source and destination address detection. While this approach allows the arithmetic processing and record table access to be relatively slow the slower elements are not sufficiently economical in price to be cost effective. Neither does the circuit of FIG. 2 utilize the fact that because the data octets arrive sequentially, they could be processed through the index look-up table and partial arithmetic computed each octet time.

Figure 3:
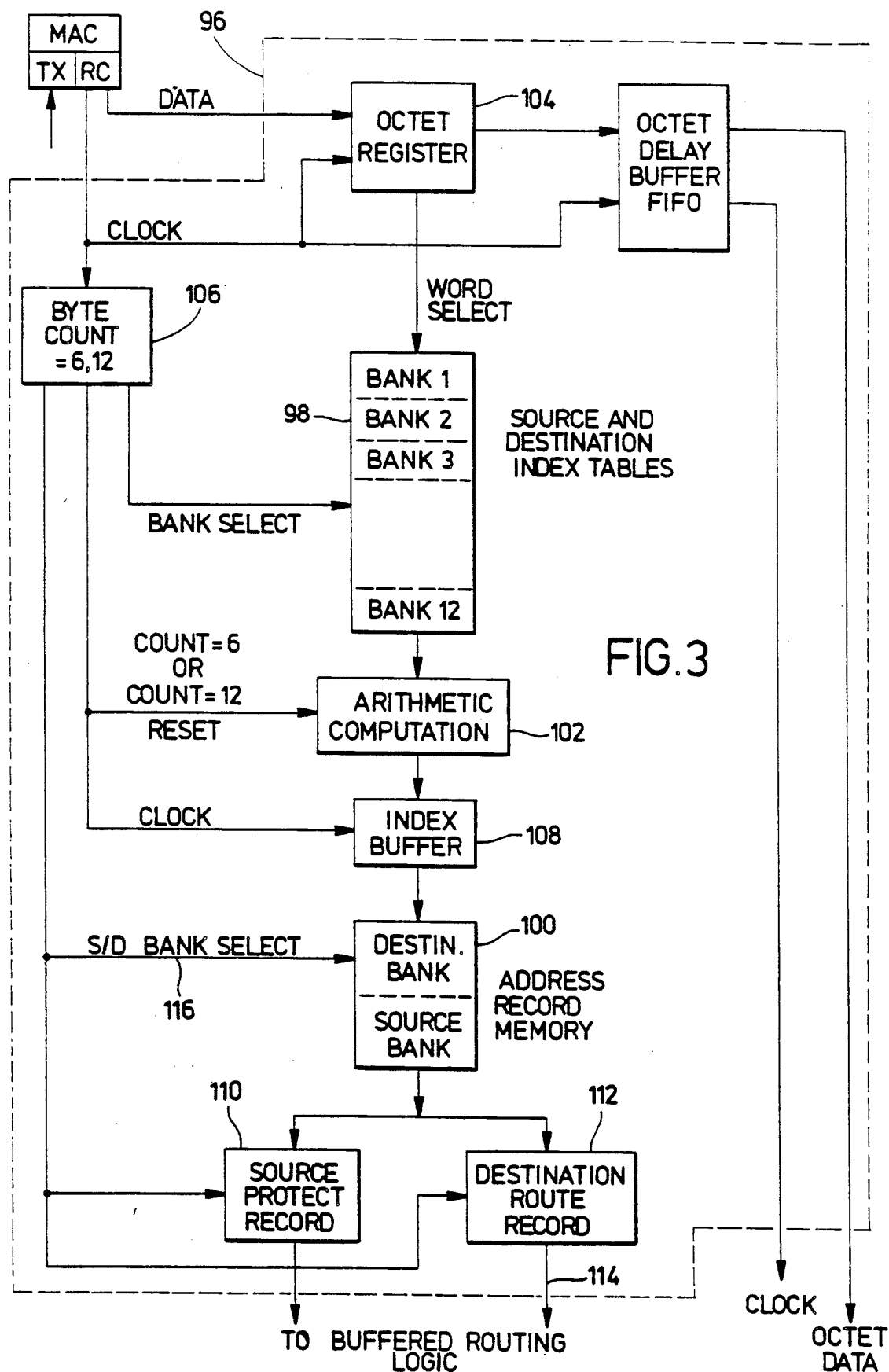
FIG. 3 is a schematic representation of an alternate circuit using serial processing at any particular node in the system to determine the address of any other node or nodes that are to receive the data packet.
Figure 4:
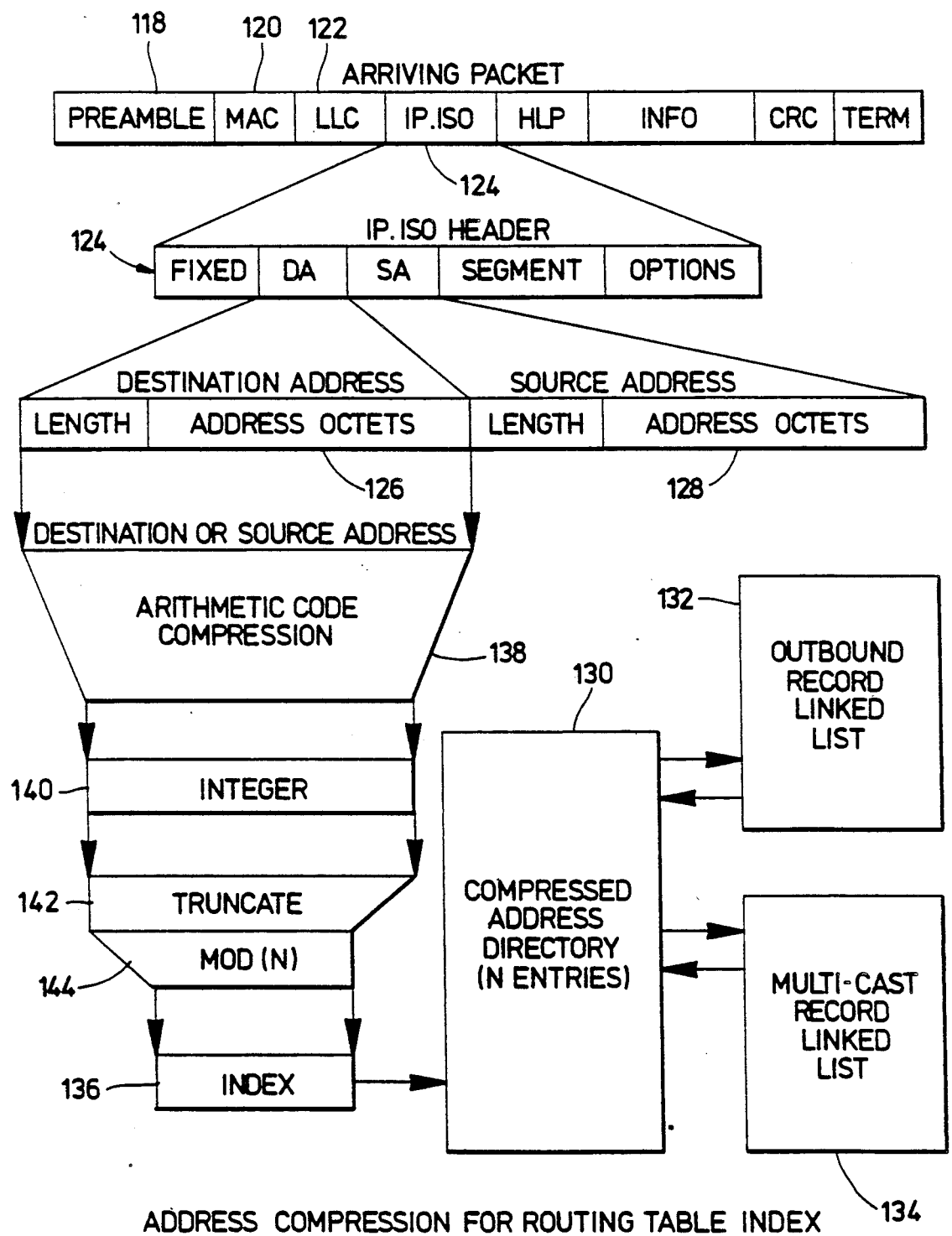
FIG. 4 is a diagrammatic representation of the circuitry for enabling the message format used by the routing system to be totally independent of the internal logical or physical structure of the address of the receiving host to whom the message format is being routed and further illustrates the manner in which a destination address or source address can be compressed to provide a usable index for accessing the address directory.

FIG. 3 is a circuit diagram of an alternate logic layout for serial processing of the incoming data by a switch 96 which is similar to switch 38. The data octets arrive sequentially and FIG. 3 discloses a logic layout which uses one bank of index table memory 98, one bank of address record memory 100 and one arithmetic computation unit 102 to accomplish both source and destination address detection. In this approach, the octet data bits are coupled serially into octet register 104 and are used as the low order address bits into the index table 98. A byte counter 106 which counts the address octets from one to twelve as they arrive in the octet register 104 is used as the high order address bits into the index table 98. From byte count one to six, the arithmetic unit 102 partially computes the final index with each output from the index table. After byte count six, the computation for the destination address mask index is complete and transferred to the index buffer 108. The arithmetic unit 102 is then reset and the six octets of source address are computed. By the time the source protection record index 110 has been computed, the data in destination route record 112 has been loaded into its output buffer on line 114. The source protect record 110 is then accessed from a second bank of the address record memory 100 using the count twelve signal on line 116 as the high order address bit. This sequential detection approach shown in FIG. 3 places special performance requirements on the index table memory and each reiteration of the arithmetic computation. That is, the access to the index table 98 and the partial computation with the table output each must be complete in less than one octet time. However, the computation is delayed one octet clock time behind the table access. Each of these timing requirements is within the available speeds of commercially available VLSI computer memory and arithmetic components. Current DRAM memories regularly run at less than 300 nanosecond access times making all but the FDDI real-time address routing practical with DRAM parts. Static RAM memories are currently available with 50 nanosecond and faster access times which makes even FDDI routing realizable. The address record memory 100 is only required to be 1/6 the speed of the index memory 98 since there are six octets between completion of the first and second record indexes. The source protect record 110 and the destination route record 112 feed into the buffered routing logic 56 of FIG. 2 to select the outbound path (MAC) for the message.

The record memory indexes may be computed by adding and accumulating the succession of six index table values to compute the mask memory index. Integer add/accumulator devices of 16 to 32 bit precision are currently available which execute a single add function in less than 80 nanoseconds. Many 16 and 32 bit microprocessors have integer add/accumulate times under 500 nanoseconds.

The address directory access circuit overview is shown schematically in FIG. 4. The arriving data packet contains a preamble 118, the first protocol layer 120 which is the Media Access Control protocal header containing the physical media destination address of the MAC receiving the packet, the second protocol layer 122 which is the logical link control and the third protocol layer 124 which is the IP.ISO Internet layer. The remainder of the packet contains the message data and housekeeping information. The third protocol layer 124 contains the unique code identifier of the receiver as the destination address data 126 and the unique code identifier of the transmitter as the source address data 128. The physical link data 120 is the actual communication channel hardware with its associated coding and modulation techniques. Physical link 120 is separated from the Internet data 124 by a combination of computer interface hardware and software called the logical link control entity data 122. Besides logically isolating the Internet layer 124 from the physical layer 120, the logical link control 122 provides a capability to multiplex packets from various higher level protocols such as TCP/IP, DECNET, and ISO/OSI over the same physical link. Each different protocol is assigned a different logical service access point (LSAP). Each LSAP is serviced by a separate set of software providing processing for each protocol as is well known with prior art. It is thus possible that one physical Internet router might be required to route packets of different protocols and therefore require two or more Internet software processes. This prospect is likely in an environment where existing networks using the TCP/IP protocols are phased over to the ISO/OSI protocols. This invention allows the same routing table access method to be employed by multiple protocols.

The IP/ISO Internet protocol data 124 provides a connectionless or datagram service between nodes on a network. Data to be sent from one node to another is encapsulated in an Internet datagram with an IP header specifying the unique global network addresses of the destination and source node. This IP datagram is then encapsulated in the logical link control 122 and physical layer protocol headers 120 and sent to a router or node. The router strips off the incoming physical header 120 and the logical link control header 122. It looks up the destination and source addresses 126 and 128 in its routing table 130, selects the appropriate outbound link, or a plurality of outbound links in the case of a multicast group destination address from table 132 and reduces the plurality of outbound links using restrictions from table 134 in the case of a multicast transmission and passes the IP datagram packet to those selected channels for LLC encapsulation and transmission. With multicast datagrams, the router must determine which outbound links represent the shortest path from the multicast source to the destinations which are members of this particular group. Without this source filtering, well-known in the art, a destination station within a group might receive many copies of the data- gram transported over different paths. Such multicast "flooding" wastes networks bandwidth and causes unnecessary congestion on busy segments of the network. The ISO IP.ISO Internet layer 124 has a number of fields. From the IP IP.ISO Internet layer 124 format it is apparent that the starting position and length of both the destination and source address fields are known or can be determined from the information within the IP header. The proposed routing table directory structure 130 needs only to know the length and values of the address octets to locate a unique table entry for that address. This novel directory access technique does not rely on any known structure of the address field other than knowing that it is a sequence containing a known number of symbols.

It can be seen from the discussion of FIG. 4 that the circuit therein could be used in an alphanumeric system such as, for example only, a library wherein an author and/or book name could be used to access a data table storing all books by author and title. In that case, destination address 126 in FIG. 4 would be an alphanumeric string of data representing the author's name and/or book titles. The arithmetic compression techniques illustrated by blocks 138, 142, and 144 could be used to compress the alphanumeric string as needed to obtain an index 136 which would select the appropriate address in table 130 which would contain all of the library material by author and book title. The selected information could then be obtained through routing tables 132 and 134.

Since the destination and source address are from the same network address space, they have an identical form and can use the same directory. Source addresses must be individual nodes and cannot be group addresses. To constrain the Internet overhead, the initial versions of the ISO Internet have been restricted to 16 octets maximum. This is a huge number of possible addresses on the order of $10^{36}$ and should be more than adequate for many years of global Internet operation.

Routing is accomplished by maintaining a routing table directory 130 at each node in the network as is well-known in the art. These tables are indexed by the destination and source address and contain information indicating which outbound communication links reach the destination node or nodes in the case of a multicast group address. The Internet routing task or program accesses the table 130, gets the outbound route information, analyzes the route information and queues the packet for transmission on one or more of the outbound ports stored in tables 132 and constrained by the records in 134. For all addresses, the Internet task also accesses the source address table which contains information defining which outbound ports should not be used for a multicast transmission to this group (destination address) from a particular source and other source filtered information.

Efficient multicast transmission requires some evaluation of the shortest route to all members of the group from the source location. The present system utilizes the directory 130 and routing table structure 132 and 134 for the already existing Link-state approach. Other existing methods have similar needs and could be incorporated into the design if another routing method is employed by a network.

The novel Internet routing task set forth herein is self learning. No information about any existing addresses or their routes need be stored in the task prior to start up. The routing information is entered into the routing table 130 as a result of the Internet routing protocol activity or network management protocols. When a router starts up, it sends out "I am here" messages using the Internet routing protocol. All of the adjacent routers or nodes send back IP routing protocol packets which, when combined with the input bound channel, contain the information necessary to fill in the routing tables for all active Internet addresses.

The novel system uses arithmetic coding of the directory index 130 as shown by the diagrammatic illustration in FIG. 4. Arithmetic coding is a powerful technique for obtaining the near minimum entropy compression of a sequence of data bits. Since a network address is just a sequence of binary data bits of known length, the minimum entropy compression of all the combinations of bit strings represented by all of the active network addresses should produce the shortest number of bits which would uniquely identify all of the addresses. This encoding could then be used as an index 136 into the routing table directory 130. Essentially arithmetic coding uses the distribution statistics of the symbols (in this case octet values) to divide a unit space into a unique fraction based on the sequence of symbols (octets) presented. As each symbol (octet) is presented, the unit space is subdivided into a smaller range. Symbols (Octets) with higher probability of occurrence reduce the range less than those with small probability, causing fewer bits to be used in encoding the higher probability octets. A detailed discussion of such method including program fragments and examples is disclosed in a paper published by Witten, Neal, and Cleary, *Communications of the ACM*, June, 1987. This paper is oriented to adaptive encoding and decoding of data streams and does not deal with the specific application of address detection. However, the method disclosed in that paper can be used for that purpose. Thus in FIG. 4, the destination address 126 is compressed by the arithmetic code process 138 to obtain an integer 140 which represents the address. If further compression is needed, the integer can be compressed through truncation 142 by methods well-known in the art and further compressed if needed by hashing 144, a technique also well-known in the art. The resulting index 136 is then used to find the unique address in the routing table directory 130. The routing switch designs 38 and 96 shown in FIGS. 2 and 3 are specific implementations of the novel arithmetic compression process employed by this invention.

After all the address octets have been processed, the last value is then the compressed value of the input address octet string. It is sufficiently compressed to be useful as a routing table index.

The novel index table construction and address compression processing of this invention takes place as follows: Addresses can be fixed and variable length bit strings embedded in the Media Access Control (MAC) 120 and Internet protocol (IP.ISO) 124 headers of the received communication packet. The maximum size (Address_length) of an address which can be compressed is set by a management decision and the physical design of a particular implementation of the process.

Symbols are consecutive sets of adjacent bits taken in sequence from the address bit string. Successive symbols may have a fixed overlap incorporating a fraction (Overlap_fraction) of the same bits from the address bit string in an adjacent symbol. All the valid bits in the address string must be included in symbols processed. For a particular implementation of the process the symbols are a fixed number of bits in length (Symbol_size) which can vary from 2 bits to any number of bits. In the embodiments presented in FIGS. 2 and 3, a symbol is an "eight" bit octet. The number of symbol positions in an address string (Num symbol_positions) is the length of the address string in bits divided by the symbol size minus the product of the symbol size and the overlap fraction. Thus, Divisor = Symbol_size-(Symbol_size × Overlap_fraction) Num_symbol_positions = Address_length/Divisor An address index table (66, 68 and 98 in FIGS. 2 and 3) has a number of banks equal to the number of symbol positions in the address string. Each bank of memory in the address index table has a number of memory locations (Bank_size) equal to "two" to the power of the symbol size. Sub-index values are stored in the non-zero locations of each bank. Thus, Bank_size = 2 raised to the Symbol_size power.

The address index table size (AI_table_size) is the product of the bank size (Bank_size) and the maximum number of symbol positions (Num_symbol_positions) being processed.

The maximum number of non-zero entries, called the allowed maximum count (Allowed_max_count), in each bank of an address index table is set by a management decision. Addresses may be encoded into the address index table until the number of non-zero entries reaches the allowed maximum count for any symbol position. If the encoding of any address value into the address index table results in the number of non-zero entries in one of the symbol positions exceeding the maximum allowed number of entries, then the address cannot be encoded into the table until another entry in this symbol position is removed, that location made zero, and the current count decremented by one. Alternately, the allowed maximum count may be increased by a management decision and all the existing address bit strings must be recoded into the address index table using the new maximum non-zero entry values.

The address index tables (66, 68 or 98) are then incrementally filled in with sub-index values as particular address bit strings are encoded into the address tables. This processing takes the following steps.

Initially the table (66, 68, and 198 in FIGS. 2 and 3) is entirely filled with zero entries and the value of all locations in the table is set to zero.

(1) A counter (Current_count) is established by the learned address logic 88 for each symbol position to keep track of the number of non-zero entries in this bank of the address index table and these counters are initially set to zero. In order to keep track of the number of addresses using a particular non-zero location in the address index table, a use counter is established in the learned address logic 88 for each non-zero location in each bank of the address index table.

(2) The allowed maximum non-zero entries value for each symbol position is obtained from a management decision.

(3) A range value (Range) is computed for each symbol position. The first range value is computed by setting the range for some symbol position to the allowed maximum count plus "one" for that symbol position. The range value for the next symbol position is the range value for the previous symbol position times the allowed maximum count plus "one" for this symbol position. The range value for each symbol position is the product of the range value of the next previously computed symbol position and the allowed maximum count plus "one" for this symbol position. The order of the symbol positions used to compute the range values is only important in that the decoding operation used to recover the original address before encoding to an integer value must use the same symbol order as that used to compute the range values. The sequence of range value computations from the last address symbol to the first address symbol must be used to preserve hierarchical structure of the structure of the original address being encoded.

Range (I) = Range (I + 1) times Allowed_max_count (I) + 1

Each symbol from an address bit string to be encoded into the address index table is processed in the same sequence as that used to process the address symbols during receipt of the packets from a transmitter for routing table access.

(1) Use the numeric value of the symbol as the address of the location in this symbol's bank of the address index table (66, 68 and 98).

(a) If the existing entry in this location of this bank of the address index table is not zero, then increment the use count for this location and no further processing of this symbol is required and the next symbol may begin processing.

(b) If the existing entry at this location in this bank of address index table is zero, then non-zero entry value is computed by (1) incrementing the current count for this symbol position, (2) checking to be sure the incremented current count is less than or equal to the allowed maximum count for this symbol position, and (3) (if the count is not greater than the maximum) computing the value of the incremented current count multiplied by the range value for this octet position and divided by the allowed maximum count for this position and storing this value in this location in the address index table and setting the use count for this location to "one". If the incremented current count is greater than the allowed maximum count for this symbol position, then this address cannot be encoded into the address index table and the management entity is notified that the address index table has overflowed unless another address is removed from the table making a use count go to "zero" and reducing the current count for this symbol position.

(2) Continue processing address bit string symbols until the entire address has been encoded into the address index table by having for each symbol in the address a non-zero value for that symbol value location in every symbol position bank of the address index table.

Address bit strings embedded in the incoming packets are compressed in the combine table outputs 70 and 72 in FIG. 2 and in arithmetic computation 102 of FIG. 3 to an integer value by adding together the stored values from the address index table bank for each symbol position where the symbol value is used as a location address into the bank for that symbol in the address index table. If any index table value accessed is zero, the processing stops and the zero detect 90 is activated. This zero indicates the address has not been encoded into the address index table.

If the number of significant bits in the encoded integer are larger than the size of the compressed address directory 130, then truncation 142 (removing some low order bits) and modulo N hashing 144 (removing some of the high order bits) may be used to reduce the size of the encoded address integer to the number of locations in the compressed address directory 130.

To decode the original address from the encoded integer and to remove the encoded address from the address index table, the decoding process starts with the symbol position for which the Range value was set to the allowed maximum count and proceeds in the same symbol sequence as the Range values were computed.

(a) Starting with the first range symbol position (the position that was set to the allowed maximum count + 1), the encoded integer—before truncation or hashing—is searched in the low order bits for a value between 1 and the allowed maximum count for the symbol position. The result of this operation is the value obtained from the address index table for this symbol position and that table sub-index value was added to the integer value to create the final integer number.

(b) The location for this remainder value in this symbol position bank of the address index table is found, the use count for this location is decremented by "one", and the position of this location in the bank is the original symbol value for this symbol position. If the decremented use count is zero, then the current count is also decremented by one. If the current count reaches zero, then no addresses are encoded into this position in the address index table.

(c) To decode the second symbol in the sequence of symbol positions used to compute the range values, the value from the previous operation is subtracted from the integer value. The resulting integer value is then searched for the low order bits for a sub-index value between the previous range value and this range value. This sub-index value is the value obtained from the address index table for this symbol position which was added to the integer value to create the final integer number. The location for this sub-index value in this bank of the address index table is found, the use count for this location is decremented by "one", and the position of this location in the bank is the original symbol value for this symbol position. If the decremented use count is zero, then the current count is also decremented by one. If the current count reaches zero, then no addresses are encoded into this position in the address index table.

(d) To decode each successive symbol in the sequence of symbol positions used to compute the range values, the sub-index value from the previous operation is subtracted from the integer value used in the previous operation. The resulting integer value is then searched in the low order bits for a sub-index value between the previous range and the current range for this symbol position. The resulting sub-index obtained with this operation is the value obtained from the address index table for this symbol position which was added to the integer value to create the final integer number. The location for this sub-index value in this bank of the address index table is found, the use count for this location is decremented by "one", and the position of this location in the bank is the original symbol value for this symbol postion. If the decremented use count is zero, then the current count is also decremented by one. If the current count reaches zero, then no addresses are encoded into this position in the address index table This process is repeated until the integer value is reduced to zero.

The sequence of symbol values produced are the symbol values used to encode the integer from the original address bit string. From these symbol values the original address bit string can be reconstructed by placing the symbol values in their symbol positions in the original bit string.

Thus there has been disclosed a data communication system which uses a routing table access method that treats network addresses as variable length symbol strings without internal structure—i.e., as flat addresses—to simplify the handling of mobile end-systems simultaneously connected to multiple access points. The system utilizes high speed, Media Access Control and Internet processes which handle multicast messages to multiple, mobile hosts. The technique is also applicable to real time database applications such as a network name service which relates a logical name (alphanumeric name) to its universal identification code. For example, an automatic telephone directory service could use this system to enable entry of a particular name and receive the telephone number of that name. Thus, the novel system allows one entity having a universal identification number to communicate with any other entity in the system having a universal identification number but whose physical location is unknown. Because the Internet router system is based on a flat logical address space, it provides efficient routing of both multicast and unicast packets independent of the internal network address format or structure.

Further, reversible arithmetic code compression techniques are used to reduce the size of the network address index and dynamic hashing is used to reduce the size of the routing table directory. Importantly, a message address is used that is structure-independent of the location or network attachment of the message receiver.

Only the preferred embodiments of the invention have been described. It should be understood that the invention is not limited to the embodiments disclosed, but is intended to embrace any alternatives, modifications, rearrangements, or substitutions of parts or elements as fall within the spirit and scope of the invention.

I claim:

1. A message routing apparatus for use in a communication system having a plurality of interconnected information networks, at least two of which have different physical media protocols, said system having an information source for transmitting a data message to an information receiver at an unknown physical location in said system comprising:
   a first unique, fixed and unchangeable code identifying said source wherever said source may be located in said system;
   a second unique, fixed and unchangeable code identifying said receiver wherever said receiver may be located in said system;
   a plurality of network message routing devices connected to each other for forwarding to each other sequentially, both of said first and second unique codes, each network routing device having means for storing each of said first and second unique codes when received and the address of the network routing device from which the codes were received; and
   one of said network routing devices receiving a data message from said source and routing said message to said receiver at said unknown location in said system; said route through said plurality of network routing devices being determined solely in accordance with said stored first and second unique identification codes and said stored addresses of said network routing devices; said message having a data format that is receiver-location structure independent with no receiver location code and network routing code therein.

2. An apparatus as in claim 1 wherein said routing devices further comprise:
   a plurality of message handling network nodes forming multipath system connections between said source and said receiver;
   a first one of said plurality of nodes communicating with said source and a second one of said nodes communicating with said receiver;
   means in said first node for receiving said first unique code from said source and means in said second node for receiving said second unique code from said receiver, both said first and second nodes respectively forwarding said first and second unique codes to all network nodes directly connected to them for storage; and
   all of said directly connected network nodes storing said first and second codes and the addresses of the forwarding nodes and further forwarding said first and second codes to all other network nodes directly connected to them as destinations within the system until all network nodes in the system have stored the first and second unique codes and the address of the directly connected forwarding nodes to enable each network node, beginning with the first node, to transmit data a message to the nearest directly connected network node from which it earlier received the unique second code thereby creating a communication path coupling the message from the source to the receiver.

3. An apparatus as in claim 2 wherein each node comprises:
   a forwarding node address storage table and a destination node address table; and
   routing logic connected to said forwarding node and destination node address storage tables for determining the shortest node route to said second node communicating with the receiver.

4. An apparatus as in claim 3 wherein said forwarding node and destination node addresses are processed by each node in parallel for storage in said forwarding and destination node address tables.

5. An apparatus as in claim 3 wherein said forwarding node and destination node addresses are processed serially by each node for storage in the forwarding and destination node address tables.

6. An apparatus as in claim 2 further comprising:
   means for arithmetically compressing said first code to generate a respective address index that uniquely identifies a succeeding destination node address stored in said tables.

7. An apparatus as in claim 3 further comprising:
   means for indicating when the node destination is a single node, when it is a group of nodes, and when it is all possible nodes; and
   means in said routing logical responsive to said indicating means for routing said message packets to those nodes necessary to reach said indicated node destination.

8. In a plurality of disparate communication networks systems communicating with each other through the use of different physical media protocols, each of said systems having at least one input and one output, a message routing system for coupling any one system input to any other system output using a message format that is structure independent of the location of said other system output, said routing system comprising:
   at least a first signal receiver/transmitter device coupled to said one system input and having a first identification code for transmission to said any one system input, said first code being unique, fixed and unchangeable at any location of said first device within said systems;
   at least a second signal receiver/transmitter device coupled to said any other system output and having a second identification code for transmission to said any other system output, said second code being unique, fixed and unchangeable at any location of said second device within said systems;
   a multiplicity of connected message routing centers, each of said routing centers being assigned a unique network address;
   means for forwarding said first and second unique identification codes from said one system input and said any other system output to all routing centers in said system for storage;
   means for enabling said first receiver/transmitter device to transmit said message format with said second unique fixed identification code of said second receiver/transmitter device to said any one system input; and each routing center, in succession, beginning with said any one system input, forwarding the message to the nearest routing center from which it earlier received the forwarded unique fixed identification code of said second receiver/transmitter device thereby establishing a communication path between the source and the receiver, said path being determined only by the fixed, unique identification codes of the first and second receiver/transmitter devices and the addresses of the forwarding message routing centers.

9. A method of communication betwen at least one source and one receiver coupled to a plurality of interconnected communication networks, at least two of which have different physical media protocols, said networks being formed of a plurality of interconnected information handling nodes comprising the steps of:
   assigning a unique, fixed identification code to each of said source and receiver which is unchanged regardless of the location of the source and receiver within the plurality of networks;
   assigning a unique network address to each of said nodes;
   transmitting said unique identification code of said source to at least one network node;
   transmitting said unique identification code of said receiver to at least one network node;
   forwarding said unique identification codes of said source and receiver from said network node to all other interconnected network nodes;
   each network node remembering the network address of the node forwarding the unique identification codes to it;
   transmitting a message from said source to a given node for said receiver at an unknown location in said communication network; and
   each network node in succession, beginning with the given node, forwarding the message to the nearest node from which it earlier received the forwarded unique identification code of said receiver thereby establishing a communication path through said interconnected networks between the source and the receiver.

10. A message routing apparatus for use in a communication system having a plurality of interconnected information networks, at least two of which have different physical media protocols, said system having an information source for transmitting a data message to an information receiver at an unknown physical location in said system comprising:
   a first unique, fixed and unchangeable code identifying said source wherever said source may be located in said system;
   a second unique, fixed and unchangeable code identifying said receiver wherever said receiver may be located in said system;
   a plurality of network message routing devices connected to each other for forwarding to each other sequentially, both of said first and second unique codes, each network routing device having means for storing each of said first and second unique codes when received and the address of each other network routing device from which the codes were received; and
   one of said network routing devices receiving a data message from said source and routing said message to said receiver at said unknown location in said system; said route through said plurality of network routing devices being determined solely in accordance with said stored first and second unique identification codes and said stored addresses of said network routing devices; said message having a data format that is receiver-location structure independent with no receiver location code and network routing code therein;

said routing devices further comprised of a plurality of message handling network nodes forming multipath system connections between said source and said receiver; a first one of said plurality of nodes communicating with said source and a second one of said nodes communicating with said receiver; means in first node for receiving said first unique code from said source and means in said second node for receiving said second unique code from said receiver, both said first and second nodes respectively forwarding said first and second unique codes to all network nodes directly connected to them for storage; and all of said directly connected to them for storage; and all of said directly connected network nodes storing said first and second codes and the addresses of the forwarding nodes and further forwarding said first and second codes to all other network nodes directly connected to them as designations within the system until all network nodes in the system have stored the first and second unique codes and the address of the directly connected forwarding nodes in source and destination index tables to enable each network node, beginning with the first node, to transmit a message to the nearest directly connected network node from which it earlier received the second unique code identifying the receiver thereby creating a communication path coupling the message from the source to the receiver; and means for a arithmetically compressing said first code to generate a respective address index that uniquely identifies a succeeding destination node address stored in said tables.

11. A message routing apparatus for use in a communication system having a plurality of interconnected information networks, at least two of which have different physical media protocols, said system having an information source for transmitting a data message to an information receiver at an unknown physical location in said system comprising:

a first unique, fixed and unchangeable code identifying said source wherever said source may be located in said system;

a second unique, fixed and unchangeable code identifying said receiver wherever said receiver may be located in said system;

a plurality of network message routing devices connected to each other for forwarding to each other sequentially, both of said first and second unique codes, each network routing device having means for storing each of said first and second unique codes when received and the address of each other network routing device from which the codes were received; and one of said network routing devices receiving a data message from said source and routing said message to said receiver at said unknown location in said system; said route through said plurality of network routing devices being determined solely in accordance with said stored first and second unique identification codes and said stored addresses of said network routing devices; said message having a data format that is receiver-location structure independent with no receiver location code and network routing code therein;

said routing devices further including a plurality of message handling network nodes forming multipath system connections between said source and said receivers; a first one of said plurality of nodes communicating with said source and a second one of said nodes communicating with said receiver; means in said first node for receiving said first unique code from said source and means in said second node for receiving said second unique code from said receiver, both said first and second nodes respectively forwarding said first and second unique codes to all network nodes directly connected to them for storage; and all of said directly connected network nodes storing said first and second codes and the addresses of the forwarding nodes and further forwarding said first and second codes to all other network nodes directly connected to them as destinations within the system until all network nodes in the system have stored the first and second unique codes and the address of the directly connected forwarding nodes to enable each network node, beginning with the first node, to transmit a message to the nearest directly connected network node from which is earlier received the second unique code identifying the receiver thereby creating a communication path coupling the message from the source to the receiver;

each node further including a forwarding node address storage table and a destination node address table; and routing logic connected to said forwarding node and destination node address storage tables for determining the shortest node route to the said second node communicating with the receiver; and means for indicating when the node destination is a single node, when it is a group of nodes, and when it is all possible nodes; and means in said routing logic responsive to said indicating means for routing said data messages to those nodes necessary to reach said indicating node destination.

12. A communication system of interconnected information networks in which data messages are routed between networks based on a non-hierarchical destination address for a receiver of the data message that does not change when the receiver changes networks, the system comprising:

a plurality of information networks;

a source of, and a receiver for, a data message; the data message including a unique, fixed and unchangeable destination address identifying the receiver to all of the information networks;

each information network in the plurality of information networks having a message handling node; the message handling nodes interconnected for routing the data message received by one message handling node from the source to another message handling node in communication with the receiver; and each message handling node including means for compressing the destination code's value to an index for a memory storing a record of information with which to route the data message to a connected message handling node for eventual routing to the receiver.

13. The communications system of interconnected information networks according to claim 12 wherein the means for compressing includes means for arithmetically compressing the destination code's value.

14. The communication system of interconnected networks according to claim 13 wherein the destination code is comprised of a predetermined number of symbol positions, each position having a symbol value.

15. The communication system of interconnected networks according to claim 14 wherein the means for arithmetically compressing an index value is comprised of:
  memory for storing sub-index values in a look-up table, the look-up table having one bank for each symbol position and each bank having a cell in which to store a sub-index value corresponding to each possible symbol value; and
  means for combining the sub-index values for each symbol of the destination address into the index value.

16. The communication system of interconnected networks according to claim 15 further comprising means for encoding a destination address into the memory look-up table.

17. The communication system of interconnected networks according to claim 15 wherein the means of encoding a destination address is comprised of:
  means for counting the number of non-zero sub-index values in each bank of the memory and incrementing the number by one;
  means for electronically calculating a sub-index value for each symbol in the destination address to be encoded, the means for electronically calculating multiplying a range value for a symbol position by the number of non-zero values stored in the bank corresponding to the symbol value plus one; and
  means for storing the sub-index value in a cell in the bank corresponding to the symbol value.

18. The communication system for inter-connected networks according to claim 12 wherein each message handling node transmits to the connected message handling node a unique, fixed and unchanging source address identifying the source in all of the networks, the means for generating generates from the source address an index value, and a node address identifying the connected node from which the source address was transmitted is stored in a memory at a location identified by the index value.

* * * * *